US012685220B2

(12) United States Patent
Boo et al.

(10) Patent No.: US 12,685,220 B2
(45) Date of Patent: Jul. 14, 2026

(54) MODULAR SYSTEMS IN PACKAGES, AND ASSOCIATED DEVICES, SYSTEMS, AND METHODS

(71) Applicant: Micron Technology, Inc., Boise, ID (US)

(72) Inventors: Kelvin Tan Aik Boo, Singapore (SG); Hong Wan Ng, Singapore (SG); Seng Kim Ye, Singapore (SG); Chin Hui Chong, Singapore (SG)

(73) Assignee: Micron Technology, Inc., Boise, ID (US)

( * ) Notice: Subject to any disclaimer, the term of this patent is extended or adjusted under 35 U.S.C. 154(b) by 897 days.

(21) Appl. No.: 17/897,156

(22) Filed: Aug. 27, 2022

(65) Prior Publication Data

US 2024/0072024 A1     Feb. 29, 2024

(51) Int. Cl.
| | |
|---|---|
| *H10W 90/00* | (2026.01) |
| *H10W 70/05* | (2026.01) |
| *H10W 70/65* | (2026.01) |
| *H10W 70/68* | (2026.01) |
| *H10W 74/00* | (2026.01) |
| *H10W 74/15* | (2026.01) |

(52) U.S. Cl.
CPC ......... *H10W 90/00* (2026.01); *H10W 70/093* (2026.01); *H10W 70/65* (2026.01); *H10W 70/68* (2026.01); *H10W 90/401* (2026.01); *H10W 90/701* (2026.01); *H10W 74/00* (2026.01); *H10W 74/15* (2026.01); *H10W 90/724* (2026.01); *H10W 90/734* (2026.01); *H10W 90/752* (2026.01); *H10W 90/754* (2026.01)

(58) Field of Classification Search
CPC . H10W 90/00; H10W 90/701; H10W 70/093; H01L 25/162; H01L 21/4853; H01L 23/13
See application file for complete search history.

(56) References Cited

U.S. PATENT DOCUMENTS

2016/0005714 A1*   1/2016  Lee ....................... H01L 23/367
                                                                            257/777

* cited by examiner

*Primary Examiner* — Errol V Fernandes
(74) *Attorney, Agent, or Firm* — Dorsey & Whitney LLP

(57) ABSTRACT

Modular systems in packages, and associated devices, systems, and methods, are disclosed herein. In one embodiment, a system comprises a main module package and an upper module package. The main module package includes a first substrate and a first electronic device mounted on a first side of the first substrate. The upper module package includes a second substrate and one or more second electronic devices mounted on a first side of the second substrate. The second substrate includes a cavity at a second side of the second substrate opposite the first side, and the upper module package is mountable on the first side of the first substrate of the main module package such that the first electronic device is positioned within the cavity and the second substrate generally surrounds at least a portion of a perimeter of the first electronic device.

21 Claims, 8 Drawing Sheets

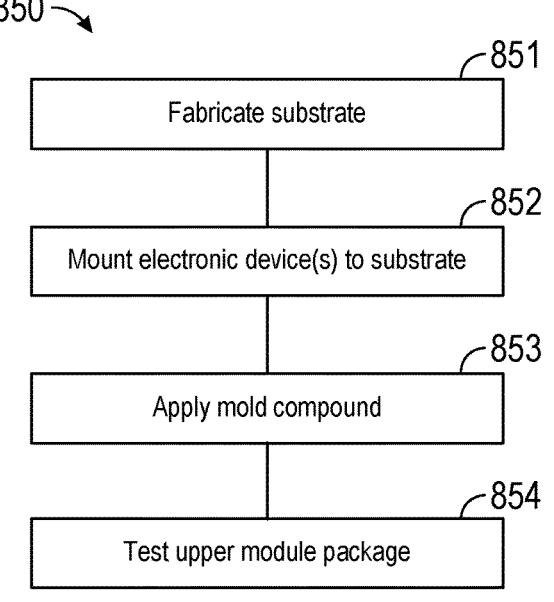

840 ⌐

```
┌─────────────────────────────────────┐ ⌐841
│         Fabricate substrate         │
└─────────────────────────────────────┘
                    │
┌─────────────────────────────────────┐ ⌐842
│  Mount electronic device(s) to substrate │
└─────────────────────────────────────┘
                    │
┌─────────────────────────────────────┐ ⌐843
│  Mount peripheral components to substrate │
└─────────────────────────────────────┘
                    │
┌─────────────────────────────────────┐ ⌐844
│       Test main module package      │
└─────────────────────────────────────┘
```

```
┌─────────────────────────────────────┐ ⌐851
│         Fabricate substrate         │
└─────────────────────────────────────┘
                    │
┌─────────────────────────────────────┐ ⌐852
│  Mount electronic device(s) to substrate │
└─────────────────────────────────────┘
                    │
┌─────────────────────────────────────┐ ⌐853
│        Apply mold compound          │
└─────────────────────────────────────┘
                    │
┌─────────────────────────────────────┐ ⌐854
│      Test upper module package      │
└─────────────────────────────────────┘
```

FIG. 8B

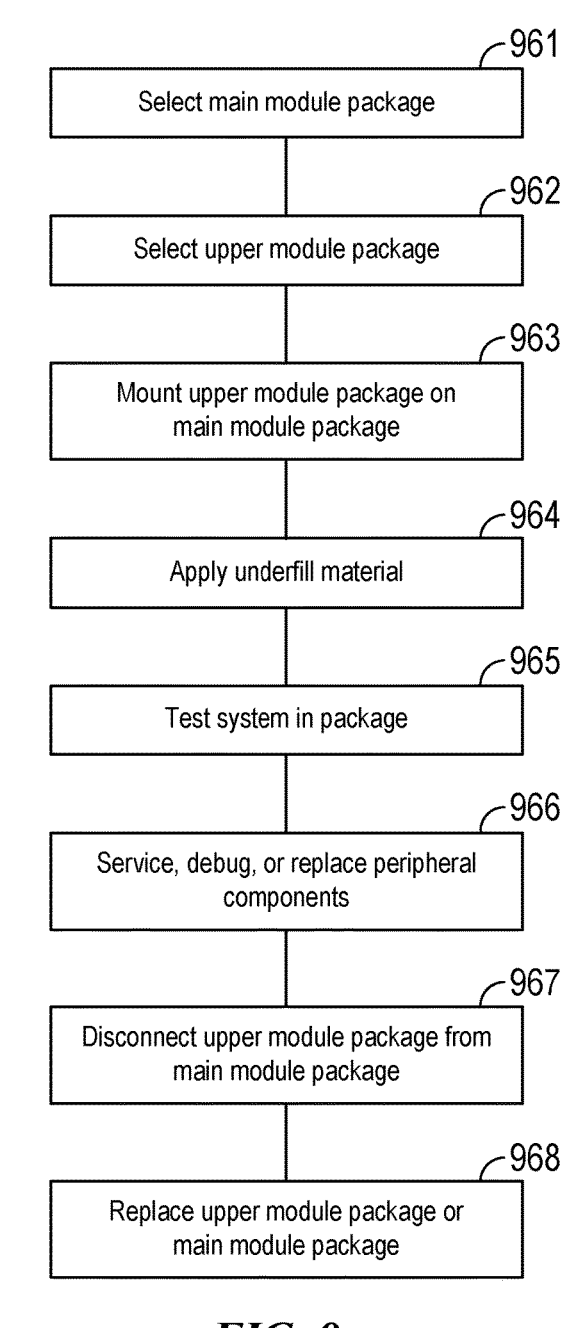

⌐960

```
┌─────────────────────────────────────┐ ⌐961
│        Select main module package   │
└─────────────────────────────────────┘
                    │
┌─────────────────────────────────────┐ ⌐962
│       Select upper module package   │
└─────────────────────────────────────┘
                    │
┌─────────────────────────────────────┐ ⌐963
│    Mount upper module package on    │
│        main module package          │
└─────────────────────────────────────┘
                    │
┌─────────────────────────────────────┐ ⌐964
│        Apply underfill material     │
└─────────────────────────────────────┘
                    │
┌─────────────────────────────────────┐ ⌐965
│       Test system in package        │
└─────────────────────────────────────┘
                    │
┌─────────────────────────────────────┐ ⌐966
│  Service, debug, or replace peripheral │
│           components                │
└─────────────────────────────────────┘
                    │
┌─────────────────────────────────────┐ ⌐967
│ Disconnect upper module package from │
│         main module package         │
└─────────────────────────────────────┘
                    │
┌─────────────────────────────────────┐ ⌐968
│  Replace upper module package or    │
│        main module package          │
└─────────────────────────────────────┘
```

FIG. 9

MODULAR SYSTEMS IN PACKAGES, AND ASSOCIATED DEVICES, SYSTEMS, AND METHODS

TECHNICAL FIELD

The present disclosure generally relates to modular systems in packages (SiPs), and associated devices, systems, and methods. For example, several embodiments of the present technology relate to upper module packages that include one or more electronic devices (e.g., NAND memory dies) and that can be mixed and matched with different main module packages that include application-specific integrated circuits (ASICs) or other electronic devices.

BACKGROUND

A package on a package (PoP) system includes two or more packages arranged in a vertical stack, with at least one of the packages placed on top of the other of the packages. The PoP system includes an interface enabling the different packages to communicate with one another. Stacking the packages reduces the horizontal footprint of the PoP system, enabling higher component density in devices (e.g., mobile phones, digital cameras, etc.). When a logic die is integrated with a memory die in a PoP system, the PoP system is commonly referred to as a system in a package (SiP).

BRIEF DESCRIPTION OF THE DRAWINGS

Many aspects of the present disclosure can be better understood with reference to the following drawings. The components in the drawings are not necessarily to scale. Instead, emphasis is placed on illustrating clearly the principles of the present disclosure. The drawings should not be taken to limit the disclosure to the specific embodiments depicted, but are for explanation and understanding only.

FIG. 8A is a flow diagram illustrating a method of assembling a main module package in accordance with various embodiments of the present technology.

FIG. 8B is a flow diagram illustrating a method of assembling an upper module package in accordance with various embodiments of the present technology.

FIG. 9 is a flow diagram illustrating a method of assembling a SiP in accordance with various embodiments of the present technology.

DETAILED DESCRIPTION

Figures 1A, 1B:
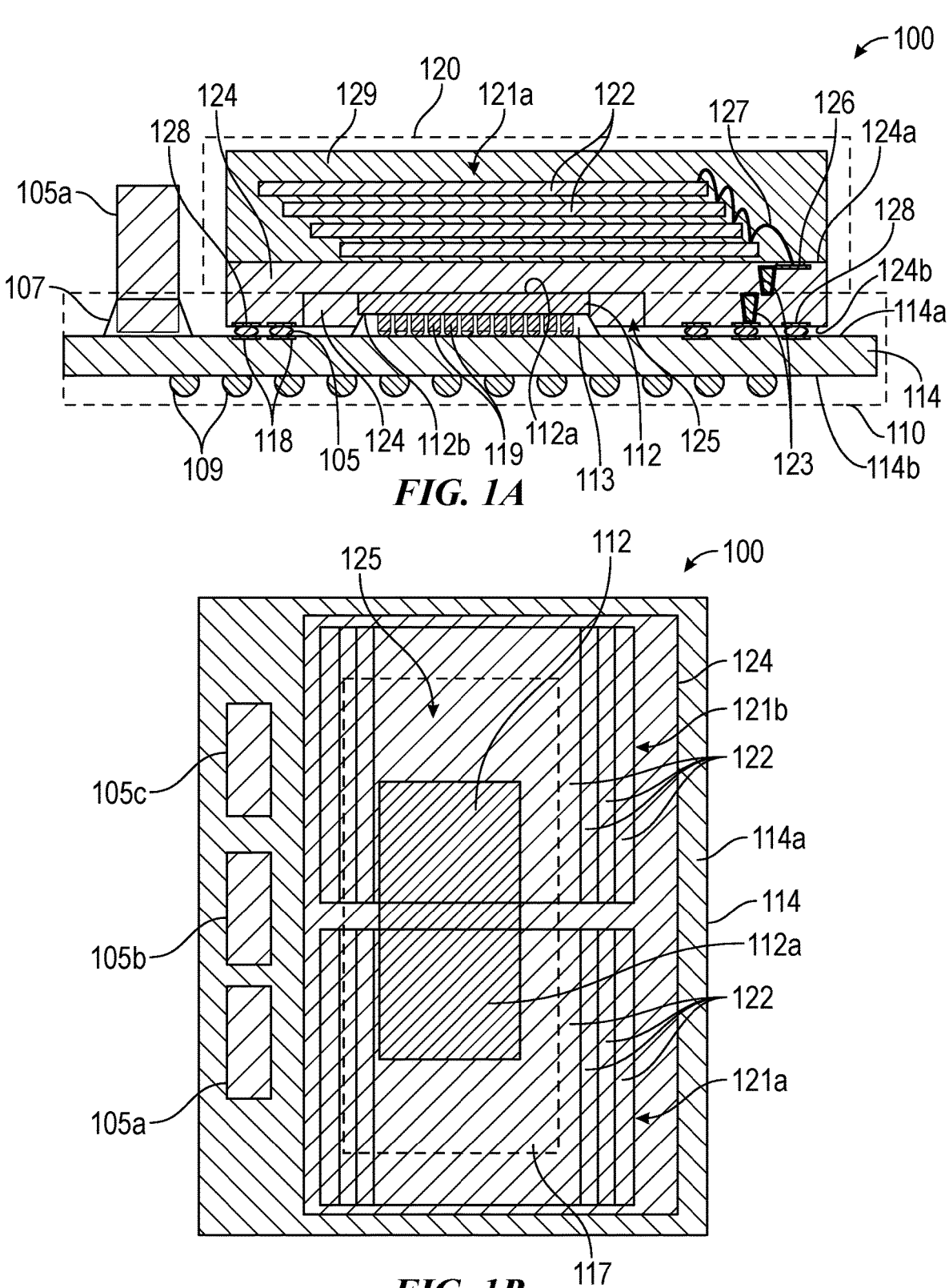
FIG. 1A is a partially schematic, cross-sectional side view of a system in a package (SiP) configured in accordance with various embodiments of the present technology.
FIG. 1B is a partially schematic, partially transparent top view of the SiP of FIG. 1A.

The following disclosure describes modular systems in packages and associated systems, devices, and methods. For example, a system of the present technology can include a main module package and an upper module package mountable on the main module package. The main module package can include a first substrate and a first electronic device (e.g., an application-specific integrated circuit) mounted on a first side of the first substrate. The upper module package can include a second substrate and one or more second electronic devices (e.g., semiconductors dies, NAND memory dies) mounted on and/or fully supported by a first side of the second substrate. The second substrate can include a cavity at a second side of the second substrate opposite the first side. When the upper module package is mounted on the first side of the first substrate of the main module package, the first electronic device of the main module package can be positioned within the cavity at the second side of the substrate, and the second substrate can generally surround at least a portion (e.g., at least two sides) of a perimeter of the first electronic device.

Some systems (e.g., some SiPs) include semiconductor dies stacked on top of an application-specific integrate circuit (ASIC). Typically, the semiconductor dies are much larger in size than the ASIC. Thus, silicon spacers are commonly used alongside the ASIC on a substrate to support the semiconductor dies as they are stacked over the ASIC and the silicon spacers. The silicon spacers are usually small in comparison to the ASIC and the semiconductor dies. As such, it is common for portions of the semiconductor dies to hang unsupported over the edges of the ASIC and the silicon spacers. Such overhang often leads to bending, deflection, and/or cracking of the semiconductor dies, to delamination of the silicon spacers to the semiconductors dies, and/or to errors or failures in the systems.

In addition, several systems commonly mold all components of the systems (e.g., semiconductor dies, ASICs, silicon spacers, and/or passive components of the systems) together. Because gaps often exist (a) between an ASIC and silicon spacers used to support the semiconductor dies and (b) underneath portions of the semiconductor dies that overhang the silicon spacers and the ASIC, voids in the mold compound can form in these areas during the molding process, potentially leading to errors or failures of the systems. Delamination between the mold compound and the silicon spacers is also common because the mold compound often does not adhere well to the small size of the silicon spacers. Delamination between the mold compound and passive components (e.g., capacitors) of the systems can also occur. Delamination of the mold compound to various components of the systems can lead to errors or failures of the systems.

Additionally, the passive components of the systems are a common source of errors or failures of the systems. When the passive components are molded together with the semiconductor dies, the ASIC, and/or the silicon spacers, however, the passive components cannot be readily accessed for debugging, servicing, and/or replacement. Instead, the mold compound must first be removed before the passive components can be accessed. Removal of the mold compound can damage the semiconductor dies and/or other components of the systems, potentially leading to uncorrectable errors or failures of the systems. Furthermore, because all components of the systems are molded together, the entire system (as opposed to just malfunctioning components) is commonly scrapped whenever an uncorrectable error or failure occurs, constituting a waste of resources.

Moreover, systems having different characteristics (e.g., different memory interfaces, different technology nodes, etc.) commonly require different manufacturing processes and associated design rules. As specific examples, different semiconductor dies and/or ASICS often require (a) different sizes and/or positioning of the semiconductor dies, the ASICS, and/or silicon spacers in the systems; and/or (b) different pinouts or interconnect layouts. As such, many package structures require end-to-end package development for the different system characteristics. In other words, components of one particular system often have unique features or characteristics rendering those components incompatible with components of another system.

To address these concerns, systems of the present technology include main module packages and upper module packages mountable on the main module packages. A main module package can include a substrate and an electronic device (e.g., an application-specific integrated circuit) mounted on a first side of the substrate. The main module package can further include electrical contacts disposed in or on (or exposed through) the first side of the substrate, and passive components (e.g., capacitors) mounted to the first side of the substrate at locations laterally offset form the electronic device.

An upper module package can include a substrate and one or more electronic devices (e.g., semiconductors dies, NAND memory dies) mounted on a first side of the substrate. The electronic devices can fit (e.g., fully fit) within a footprint of the first side of the substrate. Additionally, the substrate can include a cavity in a second side of the substrate opposite the first side. When the upper module package is mounted on the first side of the substrate of the main module package, the electronic device of the main module package can be positioned within the cavity, and the substrate of the upper module package can generally surround at least a portion (e.g., at least two sides) of a perimeter of the first electronic device. As such, the electronic devices can be supported (e.g., fully supported) by the substrate of the upper module package mounted on the substrate of the main module package, thereby (a) obviating the use of silicon spacers and (b) reducing, minimizing, and/or eliminating overhang of the one or more electronic devices and therefore bending, deflection, and/or cracking of the one or more electronic devices.

In addition, the upper module package and the main module package can be assembled and/or tested separately from one another. This can help ensure that a fully functioning upper module package is integrated with a fully functioning main module package. Also, if testing demonstrates that an upper module package or a main module package is malfunctioning, the malfunctioning upper module package or the malfunctioning main module package can be scrapped without scrapping the other component.

Furthermore, a mold compound can be disposed over the one or more electronic devices and the first side of the substrate of the upper module package. The mold compound can be constrained to the upper module package and/or a footprint of the first side of the substrate of the upper module package. Stated another way, in some embodiments of the present technology, a mold compound is not disposed over the passive components and/or other components of the main module package. As such, the passive components remain readily accessible for servicing, debugging, and/or replacement (e.g., in the event of error or failure).

Additionally, or alternatively, because the upper module package is not molded with the main module package, the upper module package can be separated from the main module package after being mounted to the main module package. This can enable swapping out a malfunctioning upper module package and/or a malfunctioning main module package for a functioning upper module package and/or a functioning upper module package, respectively. In other words, if an error or failure occurs in the upper module package or the main module package after integrating the upper module package with the main module package, the malfunctioning component can be removed and/or scrapped while salvaging use of the other module package for use in another system.

Moreover, each of the main module packages and each of the upper module packages can be designed for compatibility with multiple different upper module packages and/or multiple different main module packages, respectively. For example, two or more different upper module packages can include different interconnect structures that are used to connect electronic devices of the upper module packages to a same main module package. Thus, a same main module package can be used in combination with a first of the two or more different upper module packages to form a first system with first system specifications, and can be used in combination with a second of the two or more different upper module packages to form a second system with second system specifications different from the first system specifications. In other words, different upper module packages can be mixed and matched with main module packages, and/or different main module packages can be mixed and matched with upper module packages, to form different systems with desired design specifications.

The present technology is therefore expected to reduce the occurrence of errors or failures of systems and thereby improve reliability of the systems. In addition, the present technology is expected to reduce scrapping and waste of fully functioning components. Furthermore, the present technology is expected to facilitate easier resolution of errors (e.g., by providing ready access to passive components and other malfunctioning components of the systems). Moreover, the present technology is expected to improve (e.g., shorten) overall product development and design cycle time, such as through the ability to (a) assemble, test, and store several different main module packages and/or several different upper module packages that are each compatible with one another, and (b) select a main module package and an upper module package for integration into a system having desired design specifications.

Specific details of several embodiments of the present technology are described herein with reference to FIGS.

1-10. It should be noted that other embodiments in addition to those disclosed herein are within the scope of the present technology. Further, embodiments of the present technology can have different configurations, components, and/or procedures than those shown or described herein. Moreover, a person of ordinary skill in the art will understand that embodiments of the present technology can have configurations, components, and/or procedures in addition to those shown or described herein and that these and other embodiments can be without several of the configurations, components, and/or procedures shown or described herein without deviating from the present technology.

As used herein, the terms "vertical," "lateral," "horizontal," "upper," "lower," "top," "above," "left," "right," "below," and "bottom" can refer to relative directions or positions of features in the semiconductor devices in view of the orientation shown in FIGS. 1-10. For example, "bottom" and/or "below" can refer to a feature positioned closer to the bottom of a page than another feature. These terms, however, should be construed broadly to include semiconductor devices having other orientations, such as inverted or inclined orientations where top/bottom, over/under, above/below, up/down, and/or left/right can be interchanged depending on the orientation.

FIG. 1A is a partially schematic, cross-sectional side view of a system in a package 100 ("the SiP 100") configured in accordance with various embodiments of the present technology, and FIG. 1B is a partially schematic, partially transparent top view of the SiP 100. As shown in FIG. 1A, the SiP 100 includes a main module package 110 (shown in isolation in FIG. 2) and an upper module package 120 (shown in isolation in FIG. 3A) mounted on the main module package 110. The main module package 110 is be referred to herein as "a main module" or as "a lower module"; and the upper module package 120 is also referred to herein as "an upper module" or as "a memory module" (e.g., in embodiments in which the upper module package 120 incorporates memory dies).

Figures 2, 3A, 3B:
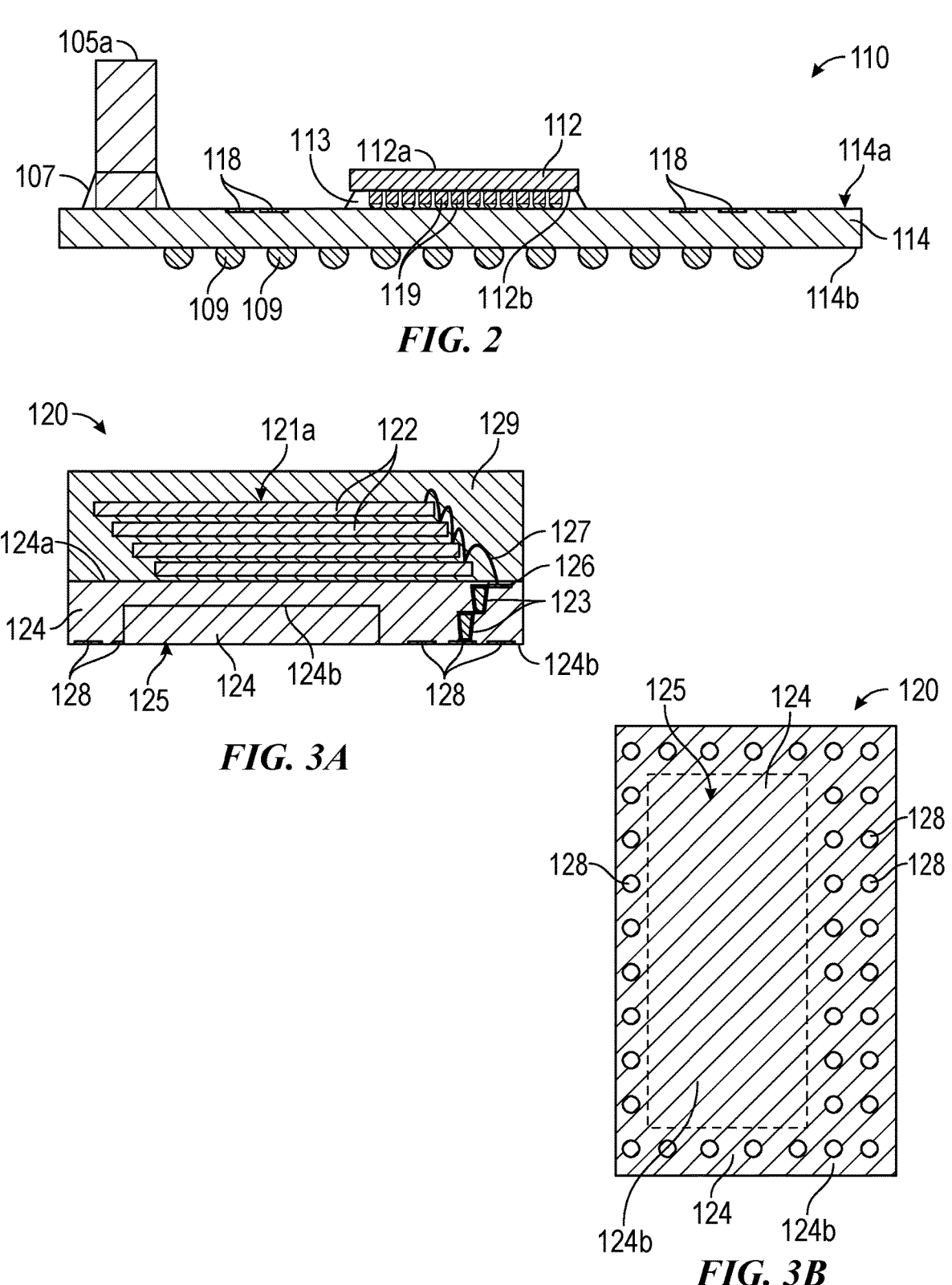
FIG. 2 is a partially schematic, cross-sectional side view of a main module package of the SiP of FIG. 1A, the main module package configured in accordance with various embodiments of the present technology.
FIG. 3A is a partially schematic, cross-sectional side view of an upper module package of the SiP of FIG. 1A, the upper module package configured in accordance with various embodiments of the present technology.
FIG. 3B is a partially schematic, bottom view of the upper module package of FIG. 3A.

Referring to FIGS. 1A and 2 together, the main module 110 includes a substrate 114 and an electronic device 112 stacked on a top side or surface 114a of the substrate 114. The substrate 114 can be can a package substrate, an interposer, an interconnector, a dielectric spacer, a redistribution structure, a printed circuit board (PCB), or the like. The electronic device 112 can be a semiconductor die, such as a logic die or an application-specific integrated circuit (ASIC). In these and other embodiments, the electronic device 112 can be or include a controller or processor, such as a field-programmable gate array (FPGA), a central processing unit (GPU), a graphics processing unit (GPU), or the like.

In FIG. 1A, the electronic device 112 is mounted to the top side or surface 114a of the substrate 114. More specifically, the electronic device 112 can be a flip chip die having a plurality of electrical contacts disposed in or on (or exposed through) an active side or surface 112b of the electronic device 112. The electrical contacts of the electronic device 112 are coupled to corresponding electrical contacts disposed in or on (or exposed through) the top side 114a of the substrate 114. The electrical contacts of the electronic device 112 and/or the electrical contacts of the substrate 114 can be bond pads, bond fingers, traces, and/or other suitable electrical contacts or connectors. Individual electrical contacts of the electronic device 112 can be coupled to corresponding ones of the electrical contacts of the substrate 114 using electrical connectors 119, such as solder balls, solder bumps, or the like. Underfill 113 (e.g., an epoxy or polymer) can be dispensed and flown (a) between the electronic device 112 and the top side 114a of the substrate 114 and (b) about the electrical connections formed between the electrical contacts of the electronic device 112 and the electrical contacts of the substrate 114, to protect or reenforce the electrical connections against shock, vibratory stress, and/or thermal stress.

Although the electronic device 112 is illustrated in an active-face-down orientation in FIGS. 1A and 2, the electronic device 112 can be arranged in an active-face-up orientation on the substrate 114 in other embodiments. For example, the electronic device 112 can be mounted to the top side 114a of the substrate 114 using a die attach film (DAF) or other material. Additionally, or alternatively, the electronic device 112 can include one or more electrical contacts (not shown) in or on (or exposed through) a side or surface 112a (e.g., on a top surface or face) opposite the side 112b of the electronic device 112. The electrical contacts in the on (or exposed through) the top side 112a of the electronic device 112 can be electrically coupled to electrical contacts (not shown) disposed in or on (or exposed through) the top side 114a of the substrate 114 (e.g., using wire bonds), and/or to corresponding electrical contacts (not shown) of the upper module 120. Furthermore, although only one electronic device 112 is included in the embodiment illustrated in FIGS. 1A and 2, main modules configured in accordance with other embodiments of the present technology can include a greater number of electronic devices 112 (e.g., more than one electronic device 112). The plurality of electronic devices 112 can be arranged side-by-side on the substrate 114, and/or the electronic devices 112 can be stacked such that at least one of the electronic devices 112 is placed on top of another of the electronic devices 112.

Referring again to FIGS. 1A and 2 together, the substrate 114 of the main module 110 includes (a) a plurality of electrical contacts 118 disposed in or on (or exposed through) the top side 114a of the substrate 114, and (b) a plurality of electrical connectors 109 (e.g., forming a ball grid array (BGA)) disposed in or on (or exposed through) a bottom side or surface 114b of the substrate 114. The electrical connectors 109 can be used to connect the main module 110 and/or the SiP 100 to external devices, systems, or packages (not shown), such as a PCB. Although not shown in FIGS. 1A and 2, the substrate 114 can further include a network of electrical connectors (e.g., conductive traces, planes, wires, vias, printed conductive lines, etc.) extending therethrough and/or thereacross. The network of electrical connectors can be configured, at least while the electronic device 112 is mounted on the substrate 114, to electrically couple the electronic device 112 to (a) one or more of the electrical connectors 109 (e.g., for communication with a device (e.g., a controller, a processor, a host device, etc.) external the SiP 100, and/or (b) one or more of the electrical contacts 118 (e.g., for communication with the upper module 120).

As best shown in FIG. 1B, the electronic device 112 is centered on the top side 114a of the substrate 114. Centering the electronic device 112 on the top side 114a of the substrate 114 can optimize routing in the substrate 114 between the electronic device 112 and various ones of the electrical connectors 109. In other embodiments, the electronic device 112 can be positioned at other locations on the top side 114a of the substrate 114. The routing in the substrate 114 between the electronic device 112 and the electrical connectors 109 can be standardized, universal, and/or reusable such that any one of a plurality of different electronic devices 112 (e.g., different ASICs) can be mounted on the top side 114*a* of the substrate 114. Additionally, or alternatively, the routing in the substrate 114 between the electronic device 112 and the electrical contacts 118 can be standardized, universal, and/or reusable for (a) one or more different electronic devices 112 (e.g., one or more different ASICs) and/or (b) one or more different upper modules 120.

Referring to FIGS. 1A-2 together, the main module 110 further includes a plurality of peripheral components 105 (identified individually in FIG. 1B as passive components 105*a*-105*c*) stacked on the top side 114*a* of the substrate 114. In some embodiments, the peripheral components 105 can include capacitors or other passive components of the SiP 100. Additionally, or alternatively, the peripheral components 105 can include active components of the SiP 100. The peripheral components 105 can be mounted to the top side 114*a* of the substrate 114 using an epoxy 107 and/or other electrical connections (e.g., solder joints).

As shown, the peripheral components 105 are positioned toward an edge of the top side 114*a* of the substrate 114 and are not covered by a molded compound. In other words, the peripheral components 105 are laterally set apart from the upper module package 120 at least when the upper module package 120 is mounted on the first side 114*a* of the substrate 114. As such, the peripheral components 105 are readily accessible, serviceable, and/or replaceable (e.g., in the event that errors or failures occur on the main module 110 and/or the SiP 100, and/or for debugging operations). In other embodiments, the peripheral components 105 can be positioned at other locations on the top side 114*a* of the substrate 114 and/or other locations on the substrate 114 (e.g., on the bottom side 114*b* of the substrate 114).

In some embodiments, the main module 110 can be assembled and/or tested separately from the upper module 120. As such, the main module 110 can be tested to confirm that it is functioning properly before the main module 110 is incorporated into the SiP 100. If the main module 110 is not functioning as intended, the malfunctioning main module 110 can swapped out for a functioning main module 110 before or after being integrated into the SiP 100. In these and other embodiments, the main module 110 can be configured to interface with a plurality of different upper modules 120. For example, as explained in greater detail below, different upper modules having different characteristics (e.g., different electronic devices, such as different semiconductor die structures, sizes, arrangements, types) can be integrated with the main module 110 to form different SiPs.

Referring now to FIGS. 1A and 3A together, the upper module package 120 includes a substrate 124 and a plurality of electronic devices 122 stacked on a top side or surface 124*a* of the substrate 124. The electronic devices 122 can include chips, semiconductor dies, or similar electronic devices. For example, the electronic devices 122 can include various types of semiconductor components and functional features, such as dynamic random-access memory (DRAM), static random-access memory (SRAM), flash (e.g., NAND or NOR) memory, or other forms of integrated circuit memory, processing circuitry, imaging components, and/or other semiconductor features. As a specific example, the electronic devices 122 include memory dies, such as NAND memory dies.

The plurality of electronic devices 122 are arranged in a plurality of three-dimensional (3D) stacks 121 (identified individually as first 3D stack 121*a* (FIGS. 1A and 1B) and second 3D stack 121*b* (FIG. 1B)) on the top side 124*a* of the substrate 124. More specifically, the electronic devices 122 of each stack 121 illustrated in FIGS. 1A, 1B, and 3A are arranged such that (a) at least one of the electronic devices 122 is placed on top of another of the electronic devices 122, and (b) the electronic devices 122 are laterally offset from one another. As shown, the lateral offset can facilitate coupling, using one or more wire bonds 127, one or more electrical contacts disposed in or on (or exposed through) a top side or surface of each electronic device 122 of a stack 121 to (i) one or more electrical contacts of another electronic device 122 of the stack 121 and/or (ii) one or more electrical contacts 126 disposed in or on (or exposed through) the top side 124*a* of the substrate 124. The electrical contacts of the electronic device 122 and/or the electrical contacts 126 of the substrate 124 can be bond pads, bond fingers, traces, and/or other suitable electrical contacts or connectors. In some embodiments, the electronic devices 122 can be attached to the substrate 124 and/or to one another using die attach film (DAF) or another adhesive material.

Although the electronic devices 122 are illustrated in active-face-up orientations in FIGS. 1A and 3A, the electronic devices 122 can be arranged in active-face-down orientations on the substrate 124 in other embodiments. Additionally, or alternatively, the electronic devices 122 can include one or more electrical contacts (not shown) on sides or surfaces (e.g., on bottom surfaces or faces) opposite the top sides of the electronic devices 122. For example, the electronic devices 122 can be arranged in a 3D stack (e.g., with or without lateral offset) such that (a) at least one of the electronic devices 122 is placed on top of another of the electronic devices 122, and (b) the electrical contacts on the bottom side of each electronic device is coupled to (i) electrical contacts disposed in or on (or exposed through) the top side 124*a* of the substrate 124 and/or (ii) electrical contacts disposed in or on (or exposed through) the top side of an electronic device 122 positioned lower in the stack 121 (e.g., using electrical connectors, such as solder bumps and/or vias). Furthermore, although illustrated with eight electronic devices 122 in FIGS. 1A and 3A, upper modules configured in accordance with other embodiments of the present technology can include a greater (e.g., more than eight) or lesser (e.g., less than eight) number of electronic devices 122. Moreover, although illustrated in 3D stacks 121 in FIGS. 1A and 3A, the electronic devices 122 can be arranged side-by-side or in another arrangement on the substrate 124. In addition, although illustrated with a uniform size and shape in FIGS. 1A and 3A, the electronic devices 122 can vary in size and/or shape in other embodiments.

Referring again to FIGS. 1A and 3A together, a mold compound 129 is disposed over the plurality of electronic devices 122 and the top surface 124*a* of the substrate 124 (e.g., to encapsulate and protect the electronic devices 122 and/or the electrical connections between different electronic devices 122 and/or between the electronic devices 122 and the substrate 124). In the illustrated embodiment, the mold compound 129 is disposed over the top side 124*a* of the substrate 124 and is constrained to the footprint of the substrate 124. Stated another way, the mold compound 129 is not disposed on the main module 110 and does not encapsulate components of the main module 110 (FIG. 1A). In other words, the mold compound 129 is only disposed on or over components of the upper module 120 and/or only encapsulates components of the upper module 120. As discussed above, this can maintain ready access to the peripheral components 105 (FIG. 1A) of the main module 110, even after the main module 110 and the upper module 120 are integrated to form the SiP 100 (FIG. 1A).

The substrate 124 can be can a package substrate, an interposer, an interconnector, a dielectric spacer, a redistribution structure, or the like. As discussed above, the substrate 124 can include a plurality of electrical contacts 126 disposed in or on (or exposed through) the top side 124a of the substrate 124. The electrical contacts 126 can be coupled to electrical contacts of the electronic devices 122.

FIG. 3B is a partially schematic, bottom view of the upper module 120. Referring to FIGS. 1A, 3A, and 3B together, the substrate 124 can further include a plurality of electrical contacts 128 disposed in or on (or exposed through) a bottom side or surface 124b of the substrate 124. As best shown in FIG. 3B, the electrical contacts 128 are positioned at bottommost portions of the bottom side 124b of the substrate 124, and/or are distributed about all or a subset of a perimeter of a cavity 125 (e.g., a recess, undercut, or cutout) in or at the bottom side 124b of the substrate 124. The electrical contacts 126 (FIGS. 1A and 3A) and/or the electrical contacts 128 can be bond pads, bond fingers, traces, and/or other suitable electrical contacts or connectors. As shown in FIGS. 1A and 3A, the electrical contacts 126 can be coupled to corresponding ones of the electrical contacts 128 via a network of interconnects 123 (e.g., conductive traces, planes, wires, vias, printed conductive lines, etc.) extending through and/or across the substrate 124. More specifically, the interconnects 123 of FIGS. 1A and 3A fan out signals transmitted to/from the electrical contacts 126 to the corresponding electrical contacts 128. The interconnects 123 can correspond to the specific electronic devices 122 incorporated into the upper module 120 and/or to the specific electronic device 112 incorporated into the main module 110. For example, the interconnects 123 within the substrate 124 can be used to electrically couple the electrical contacts 126 to the appropriate electrical contacts 128 to ensure compatibility with the main module 110. The interconnects 123 can therefore provide flexibility on ball map assignments on the bottom side 124b of the substrate 124 and/or on the bottom side 114b of the substrate 114 (e.g., to accommodate different pinouts of different electronic devices 112 incorporated into the main module 110 and/or different pinouts of different electronic devices 122 incorporated into the upper module 120).

As shown in FIGS. 1A, 1B, 3A, and 3B, the cavity 125 in or at the bottom side 124b of the substrate 124 can be sized, shaped, and/or positioned to correspond to the size, shape, and/or position, respectively, of the electronic device 112 of the main module 110. For the sake of clarity, the cavity 125 is outlined in dashed lines in FIGS. 1B and 3B. For example, a height or depth of the cavity 125 (e.g., measured vertically from the bottommost portion of the substrate 124 in FIG. 1A, or from the top side 114a of the substrate 114 when the upper module 120 is stacked on the main module 110) can correspond to (e.g., can be greater than or equal to) a height of the top side 112a of the electronic device 112 (e.g., measured vertically from the top side 114a of the substrate 114) when the electronic device 112 is mounted to the substrate 114. As another example, the cavity 125 can have a width (e.g., measured left to right in FIG. 1A) and/or a length (e.g., measured into and out of the page in FIG. 1A) that corresponds to (e.g., is greater than or equal to) a width and/or length, respectively, of the electronic device 112. More specifically, the cavity 125 can have a width and/or length such that the cavity 125 encloses or envelops the electronic device 112 at least when (a) the electronic device 112 is mounted on the substrate 114 and (b) the upper module 120 is stacked on the substrate 114. As still another example, the cavity 125 can be positioned at the bottom side 124b of the substrate 124 at a location corresponding to a location of the electronic device 112. More specifically, the cavity 125 can be positioned at a location such that the cavity 125 is aligned with and over the electronic device 112 when the upper module 120 is stacked on the top side 114a of the substrate 114 of the main module 110. In some embodiments, the cavity 125 can be formed by drilling (e.g., using a laser or other drill) a cavity into the bottom side 124b of the substrate 124.

In some embodiments, the upper module 120 can be assembled and/or tested separately from the main module 110. As such, the upper module 120 can be tested to confirm that it is functioning properly before the upper module 120 is incorporated into the SiP 100. If the upper module 120 is not functioning as intended, the malfunctioning upper module 120 can swapped out for a functioning upper module 120 before or after being integrated into the SiP 100. In these and other embodiments, the upper module 120 can be configured to interface with a plurality of different main modules. For example, as explained in greater detail below, different main modules having different characteristics (e.g., different electronic devices, such as different ASICs) can be integrated with the upper module 120 to form different SiPs. As such, multiple different upper modules and/or multiple different main modules can be assembled and tested separately, and an assembled upper module and an assembled main module that meet desired design specifications can be selected and integrated to form a corresponding SiP.

Referring again to FIG. 1A, after assembling and/or testing the upper module 120 and the main module 110, the upper module 120 and the main module 110 can be integrated to form the SiP 100. More specifically, the upper module 120 can be stacked on and mounted to the first side 114a of the substrate 114 of the main module 110 by (a) aligning the cavity 125 in the substrate 124 of the upper module 120 over the electronic device 112, (b) lowering the upper module 120 toward the top side 114a of the substrate 114 until the electronic device 112 is positioned with and/or is enveloped (e.g., encapsulated) by the cavity 125 (as best shown in FIG. 1B), and (c) coupling the electrical contacts 128 disposed in or on (or exposed through) the bottom side 124b of the substrate 124 to corresponding ones of the electrical contacts 118 disposed in or on (or exposed through) the top side 114a of the substrate 114. The electrical contacts 128 can be coupled to the electrical contacts 118 using electrical connectors 104, such as solder balls, solder bumps, or the like. Although not shown in FIG. 1A, underfill (e.g., an epoxy or polymer) can be dispensed and flown (a) between the bottom side 124b of the substrate 124 and the top side 114a of the substrate 114 and (b) about the electrical connections formed between the electrical contacts 128 of the upper module 120 and the electrical contacts 118 of the main module 110, to protect or reenforce the electrical connections against shock, vibratory stress, and/or thermal stress.

As shown in FIG. 1A, when the upper module 120 is mounted to the main module 110, the electronic device 112 of the main module 110 is positioned within the cavity 125 and beneath the electronic devices 122 of the upper module 120 while portions of the substrate 124 of the upper module 120 extend downwards toward the top side 114a of the substrate 114 about the electronic device 112. As such, the present technology obviates the practice using spacers (e.g., silicon spacers) to support the electronic devices 122 while stacking the electronic devices 122 over the electronic device 112. In addition, the electronic devices 122 are positioned within (e.g., fully within) the footprint of the substrate 124. Thus, the electronic devices 122 do not hang over the edges of the substrate 124 and/or are supported (e.g., fully supported) by the substrate 124. Therefore, it is expected that the present technology will reduce, minimize, or eliminate deflection and/or crack of the electronic devices 122. Furthermore, as discussed above, the mold compound 129 is constrained to the footprint of the top side 124*a* of the substrate 124. As such, the mold compound 129 is not disposed within the cavity 125 and/or about the electronic device 112 of the main module 110. Therefore, the present technology is expected to reduce, minimize, or eliminate the risk of voids or delamination of the mold compound 129 in the cavity 125.

Figure 4:
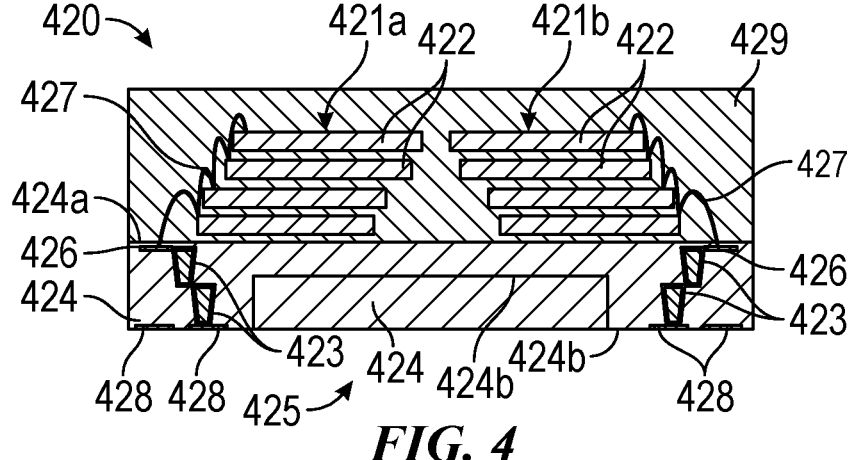
FIG. 4 is a partially schematic, cross-sectional side view of another upper module package configured in accordance with various embodiments of the present technology.

FIG. 4 is a partially schematic, cross-sectional side view of another upper module package 420 ("upper module 420") configured in accordance with various embodiments of the present technology. As shown, the upper module 420 is generally similar to the upper module 120 of FIGS. 1A, 3A, and 3B. For example, the upper module 420 includes a plurality of electronic devices 422 arranged in a plurality of 3D stacks 421 (identified individually as first 3D stack 421*a* and second 3D stack 421*b*) and mounted on a top side 424*a* of a substrate 424. Electrical contacts of the plurality of electronic devices 422 are coupled, using corresponding wire bonds 427, to corresponding electrical contacts 426 disposed in or on (or exposed through) the top side 424*a* of the substrate 424. A mold compound 429 is disposed over and encapsulates the plurality of electronic devices 422. Interconnects 423 in the substrate 424 fan out and couple the electrical contacts 426 to corresponding electrical contacts 428 disposed in or on (or exposed through) a bottom side 424*b* of the substrate 424. The substrate 424 also includes a cavity 425 (e.g., a recess, undercut, or cutout) in or at the bottom side 424*b* of the substrate 424 to accommodate an electronic device of a main module (e.g., the electronic device 112 of the main module 110 of FIGS. 1A-2).

In contrast to the electronic devices 122 of the upper module 120 of FIGS. 1A, 3A, and 3B, the electronic devices 422 of the upper module 420 of FIG. 4 are arranged differently on the top side 424*a* of the substrate 424. For example, the 3D stacks 421 of the electronic devices 422 are positioned at different locations on the top side 424*a* of the substrate 424 and/or in different orientations from the 3D stacks 121 of the electronic devices 122 of the upper module 120. Additionally, or alternatively, characteristics of one or more of the electronic devices 422 can vary from characteristics of one or more of the electronic devices 122. For example, one or more of the electronic devices 422 can have different dimensions, different memories, different electrical contact layouts than one or more of the electronic devices 122. As such, the manner in which the one or more electronic devices 422 are coupled to the electrical contacts 426 and/or 428 and/or the locations of such electrical connections, can vary from the manner in which the one or more electronic devices 122 of the upper module 120 are coupled to the electrical contacts 126 and/or 128 (e.g., via the interconnects 123) and/or the locations of such electrical connections, respectively.

As a specific example, the layout of the interconnects 423 in the substrate 424 can be different from the layout of the interconnects 123 in the substrate 124 of FIGS. 1A and 3A, and/or can specifically correspond to the electronic devices 422 incorporated into the upper module 420. In some embodiments, the layout of the interconnects 423 can also correspond to the pinout of the electronic device 112 of the main module 110 of FIGS. 1A-2. Thus, the layout of the electrical contacts 428, the interconnects 423, the electrical contacts 426, the wire bonds 427, and/or the electrical contacts (not shown) of the electronic devices 422 can maintain compatibility of the upper module 420 with the main module 110 of FIGS. 1A-2.

As such, although the upper modules 120 and 420 may have different characteristics and/or may be configured for different functions and/or to meet different design specifications, either the upper module 420 or the upper module 120 can be selected and mounted on the main module 110 of FIGS. 1A-2 to form a SiP that meets a set of desired design goals. As such, the upper module 420 can be used with the main module 110 in lieu of the upper module 120, and vice versa. Additionally, or alternatively, a functioning upper module 420 and/or a functioning upper module 120 can be used to replace or swap out a malfunctioning upper module 420 and/or a malfunctioning upper module 120. Such modularity is expected to improve overall product development and shorten design cycle time. For example, one or more upper modules 120, one or more upper modules 420, and/or one or more main modules 110 can be separately assembled and tested. Upper modules 120, upper modules 420, and/or main modules 110 proven via testing to be functioning properly can then be stored for use at a later point in time. In addition, upper modules 120, upper modules 420, and/or main modules 110 proven via testing to be malfunctioning can either be debugged or scrapped without debugging or scrapping other functioning components or modules, thereby preserving functioning resources and avoiding starting a SiP or package design from scratch. A functioning main module 110 and a functioning upper module 120 or 420 having desired characteristics can then be selected 'off the shelf' and integrated with one another to form a SiP (e.g., the SiP 100 of FIGS. 1A and 1B) that meets desired design goals of a final product. Debugging or servicing of the SiP can also be readily performed, such as by servicing, debugging, or replacing the readily accessible peripheral components 105 (FIG. 1A) of the selected main module 110, even after integration of the upper module 120 or 420 with the main module 110.

Although shown in FIGS. 1A, 1B, and 3A-4 with rectangular cavities 125 and 425 that are designed to fully surround the perimeter of the electronic device 112 of the main module 110 and/or to fully envelope the electronic device 112 about the perimeter and along the top side 112*a* of the electronic device 112, upper modules of other embodiments of the present technology can include different cavity configurations, some of which may offer improved air circulation about and/or thermal dissipation for the electronic device 112. Various examples of other cavity configurations of the present technology are illustrated in FIGS. 5A-7B.

Figure 5A:
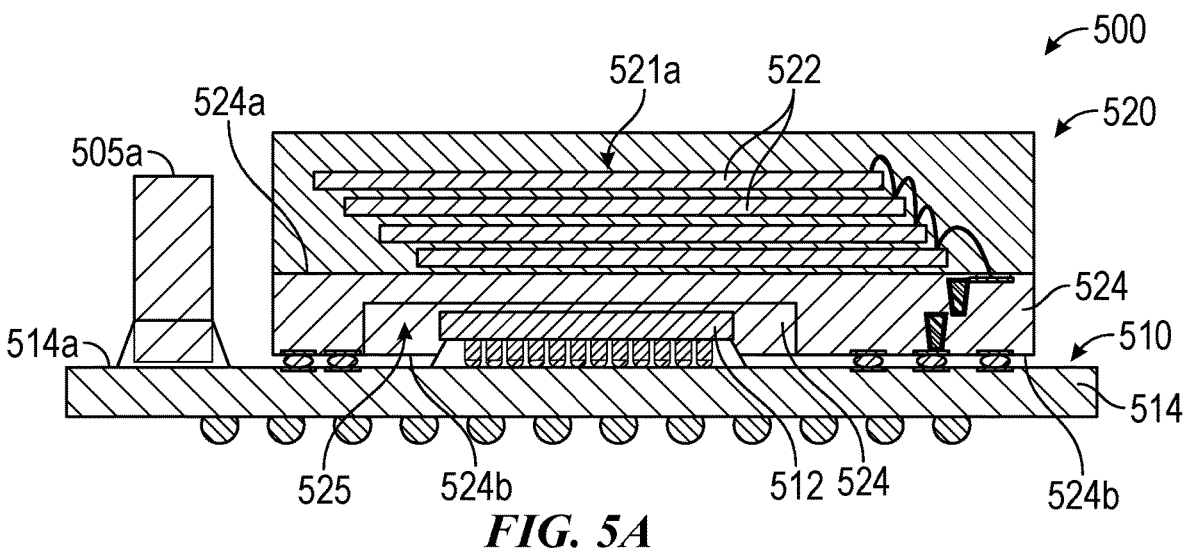
FIG. 5A is a partially schematic, cross-sectional side view of another SiP configured in accordance with various embodiments of the present technology.
Figure 5B:
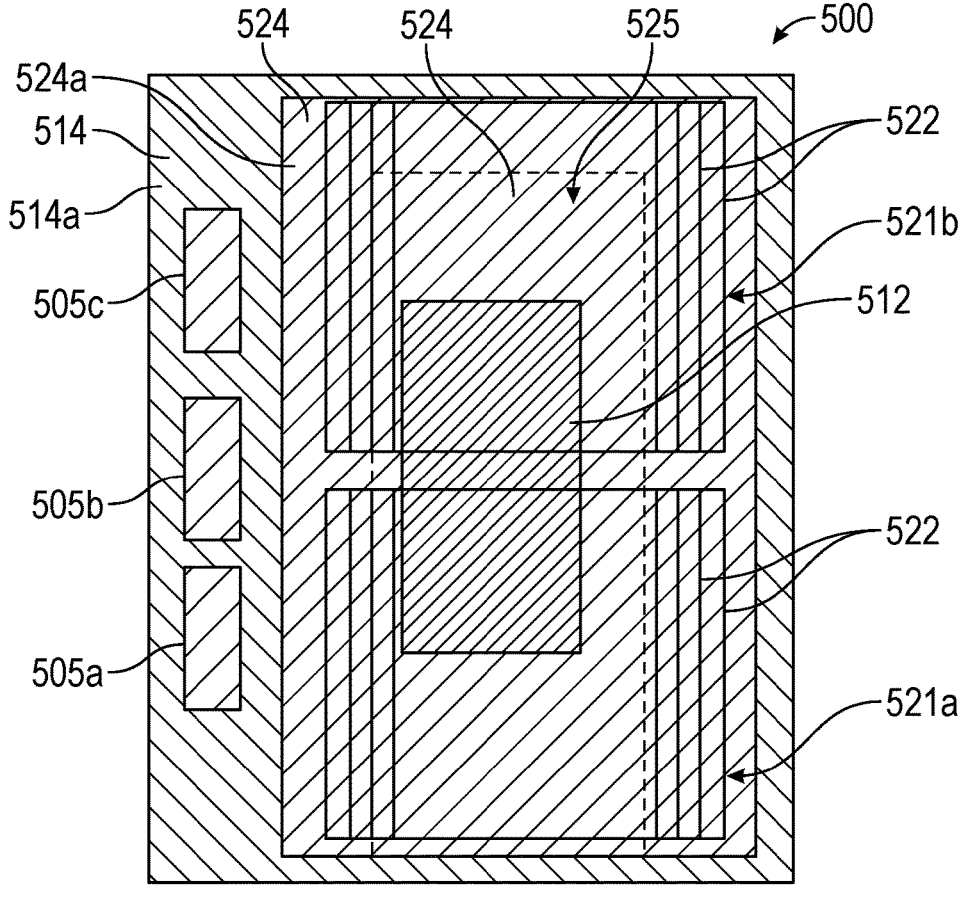
FIG. 5B is a partially schematic, partially transparent top view of the SiP of FIG. 5A.

FIG. 5A is a partially schematic, cross-sectional side view of another SiP 500 configured in accordance with various embodiments of the present technology, and FIG. 5B is a partially schematic, partially transparent top view of the SiP 500. As shown, the SiP 500 includes an upper module 520 mounted on a main module 510. The upper module 520 and the main module 510 of FIGS. 5A and 5B are generally similar to the upper module 120 and/or 420 and the main module 110, respectively, of FIGS. 1A-4. Thus, a detailed discussion of the individual components of the upper module 520 and the main module 510 of the SiP 500 is omitted for the sake of brevity. Nevertheless, similar reference numbers are used in FIGS. 5A and 5B as those used in FIGS. 1A-4 to indicate identical or at least generally similar components across the figures.

A substrate 524 of the upper module 520 includes a cavity 525 (e.g., a recess, undercut, or cutout) in or at a bottom side 524b of the substrate 524. For the sake of clarity, the cavity 525 is outlined in dashed lines in FIG. 5B. As best shown in FIG. 5B, although rectangular in shape, the cavity 525 is n-shaped in that the cavity 525 extends to an edge or side face of the substrate 524 (e.g., the bottom edge or side face of the substrate 524 in FIG. 5B, the top edge or side face of the substrate 724 in FIG. 5B in other embodiments) that is oriented generally perpendicular to a top side 524a of the substrate 524. Thus, when an electronic device 512 of the main module 510 is positioned within the cavity 525 of the upper module 520, the substrate 524 of the upper module 520 does not fully surround the electronic device 512 about its perimeter. Instead, absent any filler material within the cavity 525 while the upper module 520 is mounted to the main module 510, the substrate 524 partially surrounds the perimeter of the electronic device 512 (e.g., about three sides of the electronic device 512), and the electronic device 512 is exposed through the edge or side face of the substrate 524. As discussed above, this can improve air circulation about and/or thermal dissipation for the electronic device 512.

Figure 6A:
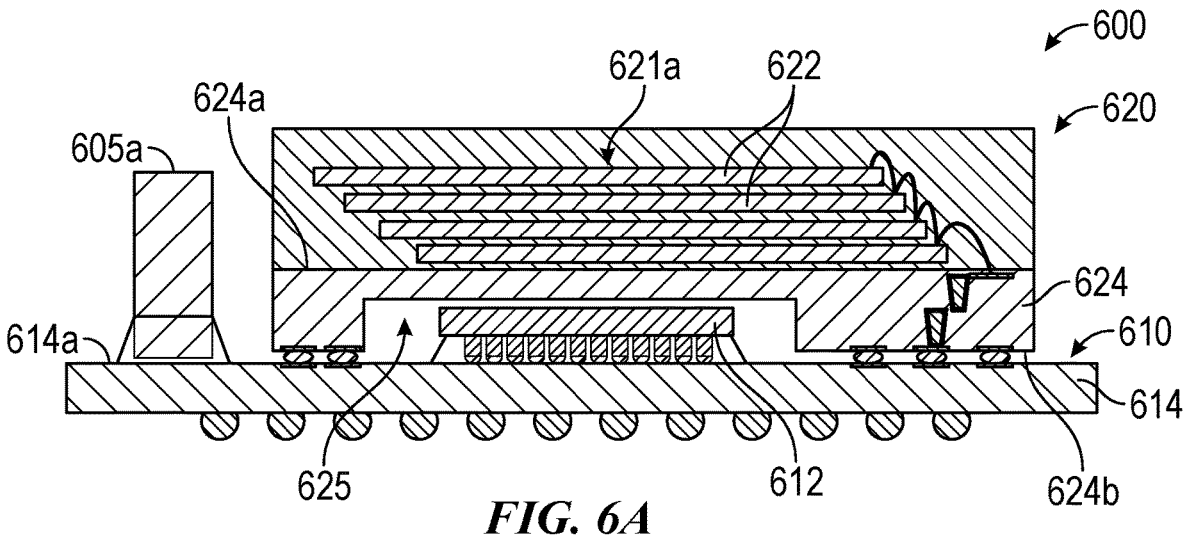
FIG. 6A is a partially schematic, cross-sectional side view of still another SiP configured in accordance with various embodiments of the present technology.
Figure 6B:
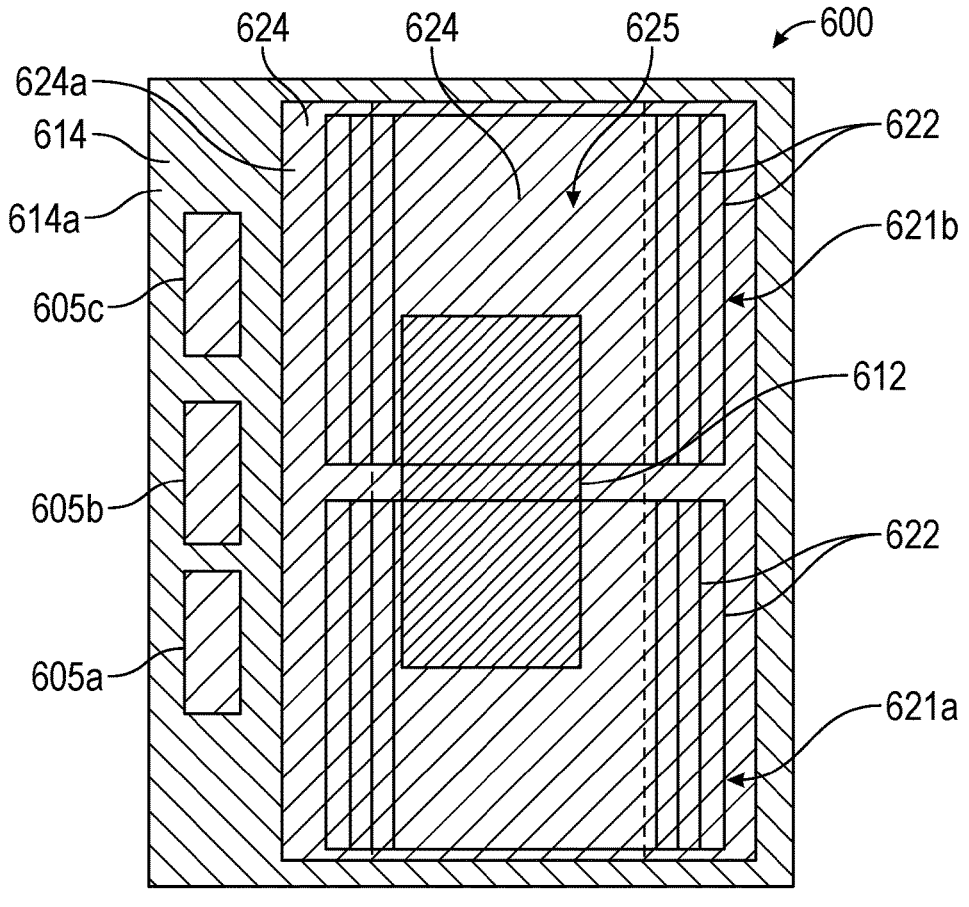
FIG. 6B is a partially schematic, partially transparent top view of the SiP of FIG. 6A.

FIG. 6A is a partially schematic, cross-sectional side view of still another SiP 600 configured in accordance with various embodiments of the present technology, and FIG. 6B is a partially schematic, partially transparent top view of the SiP 600. As shown, the SiP 600 includes an upper module 620 mounted on a main module 610. The upper module 620 and the main module 610 of FIGS. 6A and 6B are generally similar to the upper module 120 and/or 420 and the main module 110, respectively, of FIGS. 1A-4. Thus, a detailed discussion of the individual components of the upper module 620 and the main module 610 of the SiP 600 is omitted for the sake of brevity. Nevertheless, similar reference numbers are used in FIGS. 6A and 6B as those used in FIGS. 1A-4 to indicate identical or at least generally similar components across the figures.

A substrate 624 of the upper module 620 includes a cavity 625 (e.g., a recess, undercut, or cutout) in or at a bottom side 624b of the substrate 624. For the sake of clarity, the cavity 625 is outlined in dashed lines in FIG. 6B. As best shown in FIG. 6B, although rectangular in shape, the cavity 625 is a tunnel extending from one edge or side face of the substrate 624 (e.g., the bottom edge or side face of the substrate 624 in FIG. 6B) to an opposite edge or side face of the substrate 624 (e.g., the top edge or side face of the substrate 624 in FIG. 6B) that are oriented generally perpendicular to a top side 624a of the substrate 624. Thus, when an electronic device 612 of the main module 610 is positioned within the cavity 625 of the upper module 620, the substrate 624 of the upper module 620 does not fully surround the electronic device 612 about its perimeter. Instead, absent any filler material within the cavity 625 while the upper module 620 is mounted to the main module 610, the substrate 624 partially surrounds the perimeter of the electronic device 612 (e.g., about two sides of the electronic device 612), and the electronic device 612 is exposed through the pair of opposite edges or side faces of the substrate 624. As discussed above, this can improve air circulation about and/or thermal dissipation for the electronic device 612.

Figures 7A, 7B:
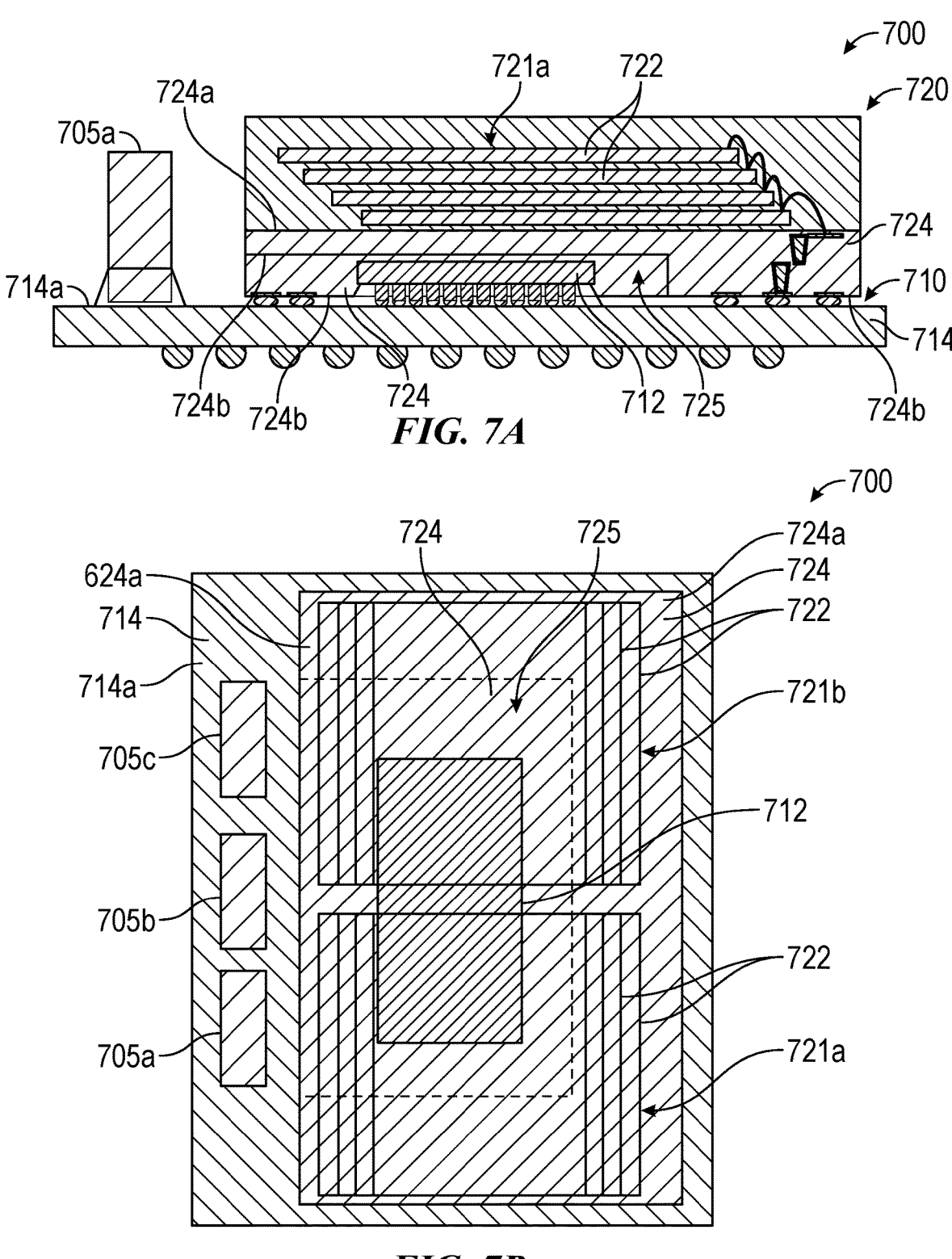
FIG. 7A is a partially schematic, cross-sectional side view of yet another SiP configured in accordance with various embodiments of the present technology.
FIG. 7B is a partially schematic, partially transparent top view of the SiP of FIG. 7A.

FIG. 7A is a partially schematic, cross-sectional side view of yet another SiP 700 configured in accordance with various embodiments of the present technology, and FIG. 7B is a partially schematic, partially transparent top view of the SiP 700. As shown, the SiP 700 includes an upper module 720 mounted on a main module 710. The upper module 720 and the main module 710 of FIGS. 7A and 7B are generally similar to the upper module 120 and/or 420 and the main module 110, respectively, of FIGS. 1A-4. Thus, a detailed discussion of the individual components of the upper module 720 and the main module 710 of the SiP 700 is omitted for the sake of brevity. Nevertheless, similar reference numbers are used in FIGS. 7A and 7B as those used in FIGS. 1A-4 to indicate identical or at least generally similar components across the figures.

A substrate 724 of the upper module 720 includes a cavity 725 (e.g., a recess, undercut, or cutout) in or at a bottom side 724b of the substrate 724. For the sake of clarity, the cavity 725 is outlined in dashed lines in FIG. 7B. As best shown in FIG. 7B, although rectangular in shape, the cavity 725 is c-shaped in that the cavity 725 extends to an edge or side face of the substrate 724 (e.g., the left edge or side face of the substrate 724 in FIG. 7B, the right edge or side face of the substrate 724 in FIG. 7B in other embodiments) that is oriented generally perpendicular to a top side 724a of the substrate 724. Thus, when an electronic device 712 of the main module 710 is positioned within the cavity 725 of the upper module 720, the substrate 724 of the upper module 720 does not fully surround the electronic device 712 about its perimeter. Instead, absent any filler material within the cavity 725 while the upper module 720 is mounted to the main module 710, the substrate 724 partially surrounds the perimeter of the electronic device 712 (e.g., about three sides of the electronic device 712), and the electronic device 712 is exposed through the edge or side face of the substrate 724. As discussed above, this can improve air circulation about and/or thermal dissipation for the electronic device 712.

Although shown with rectangular cavities in FIGS. 1A, 1B, and 3A-7B, substrates of upper modules in other embodiments of the present technology can include different shaped cavities. For example, cavities of the present technology can be any polygon, circular, triangular, pentagonal, hexagonal, octagonal, and/or irregularly shaped. Furthermore, although shown generally centered in the cavities illustrated in FIGS. 1A, 1B, and 3A-7b, the electronic devices of main modules of other embodiments of the present technology can be offset from the center of a corresponding cavity.

FIG. 8A is a flow diagram illustrating a method 840 of assembling a main module package in accordance with various embodiments of the present technology. The main module package can be the main module package 110, 510, 610, and/or 710 of FIGS. 1A, 1B, 2, 5A, 5B, 6A, 6B, 7A, and/or 7B, and/or another main module package of the present technology. The method 840 is illustrated as a set of steps or blocks 841-844. All or a subset of any one or more of the blocks 841-844 can be executed in accordance with the discussion above.

The method 840 begins at block 841 by fabricating a substrate for the main module package. Fabricating the substrate can include forming electrical contacts at a first side of the substrate, forming electrical contacts at a second side of the substrate, and/or forming interconnects or vias within the substrate to couple electrical contacts at the second side to corresponding electrical contacts at the first side. In some embodiments, the electrical contacts at the first side include (a) first electrical contacts (e.g., bond pads) configured to be coupled to an electronic device, (b) second electrical contacts (e.g., bond pads) about a perimeter of the first electrical contacts and configured to be coupled to a substrate of an upper module package, and/or (c) third electrical contacts (e.g., bond pads) laterally offset or space apart from the first and second electrical contacts and configured to be coupled to peripheral components mounted on the substrate. The first electrical contacts at the first side of the substrate can be centered on the first side of the substrate and/or laterally offset or spaced apart from the center of the substrate. The electrical contacts at the second side of the substrate can include bond pads or other electrical connectors configured to be coupled to an external device, such as a printed circuit board.

At block 842, the method 840 continues by mounting one or more electronic devices on the first side of the substrate. In some embodiments, the electronic device(s) include a semiconductor die, a controller, an ASIC, an FPGA or another type of electronic device. Mounting the electronic device(s) on the first side of the substrate can include mounting an electronic device such that electrical contacts on an active side or face of the electronic device is coupled to electrical contacts at the first side of the substrate (e.g., using solder). In these and other embodiments, mounting the electronic device(s) on the first side of the substrate can include applying an underfill material between the active side of the electronic device and the first side of the substrate, and about electrical connections formed between electrical contacts at the first side of the substrate and electrical contacts at the active side of the electronic device. In other embodiments, mounting the electronic device(s) on the first side of the substrate can include mounting an electronic device on the first side of the substrate such that an active side or face of the electronic device is oriented away from the first side of the substrate. The electronic device can be mounted to the first side of the substrate using a die attach film or other methodology. Electrical contacts at the active side of the electronic device can be coupled to electrical contacts at the first side of the substrate using, for example, wire bonds or other electrical connectors. In some embodiments, mounting the electronic device(s) on the first side of the substrate can include mounting the electronic device(s) such that the electronic device(s) are positioned at a center of the first side of the substrate, or are positioned at a location laterally offset or spaced apart from the center of the first side of the substrate. In these and other embodiments, mounting the electronic device(s) on the first side of the substrate can include mounting multiple electronic devices on the first side of the substrate, and/or arranging multiple electronic devices in a stack on the first side of the substrate.

At block 843, the method 840 continues by mounting peripheral components on the first side of the substrate. Peripheral components can include active or passive components, such as capacitors. Mounting peripheral components on the first side of the substrate can include coupling the peripheral components to electrical contacts at the first side of the substrate, such as electrical contacts laterally offset or spaced apart from electrical contacts at the first side of the substrate that are configured to be coupled to an electronic device and/or a substrate of an upper module package. In these and other embodiments, mounting the peripheral component on the first side of the substrate can include mounting the peripheral components such that they are readily accessible (e.g., not encapsulated by a mold compound, and/or are easily accessible for debugging, servicing, or replacement). The peripheral components can be mounted on the first side of the substrate before, during, or after mounting an upper module package on the first side of the substrate.

At block 844, the method 840 continues by testing the main module package. Testing the main module package can include testing the main module package independent of and/or separate from a corresponding upper module package. For example, testing the main module package can include testing the main module package when an upper module package is not mounted on the main module package. In these and other embodiments, testing the main module package can include testing the main module package after mounting an upper module package on the main module package. Such testing of the main module package after the upper module package has been mounted on the main module package can include testing the main module package independent of the upper module package and/or testing the main module package in tandem with (e.g., together with, or at the same time as testing) the upper module package.

Testing the main module package can include determining that the main module package is functioning as intended (e.g., without errors). When the main module package is proven via testing to be functioning as intended, the main module package can be cleared for integration with an upper module package, and/or can be stored for later selection and use with a corresponding upper module package. Alternatively, testing the main module package can include determining that the main module package is not functioning as intended. Determining that the main module package is not functioning as intended can include identifying a component of the main module package that is malfunctioning. In these and other embodiments, determining that the main module package is not functioning as intended can include debugging, servicing, and/or replacing malfunctioning components of the main module package. Additionally, or alternatively, determining that the main module package is not functioning as intended can include scrapping the main module package.

Although the steps of the method 840 are discussed and illustrated in a particular order, the method 840 is not so limited. In other embodiments, the method 840 can be performed in a different order. For example, block 842 can be performed after block 843. In these and other embodiments, any of the steps 841-844 of the method 840 can be performed before, during, and/or after any of the other steps 841-844 of the method 840. For example, electrical connectors can be formed at the second side of the substrate (block 841) before, during, or after performing all or a subset of the blocks 842, 843, and/or 844. Furthermore, the method 840 can be altered and still remain within these and other embodiments of the present technology. For example, one or more steps 841-844 of the method 840 can be omitted and/or repeated in some embodiments. As a specific example, block 844 can be omitted in some embodiments.

FIG. 8B is a flow diagram illustrating a method 850 of assembling an upper module package in accordance with various embodiments of the present technology. The upper module package can be the upper module package 120, 420, 520, 620, and/or 720 of FIGS. 1A, 1B, 3A, 3B, 4, 5A, 5B, 6A, 6B, 7A, and/or 7B, and/or another upper module package of the present technology. The method 850 is illustrated as a set of steps or blocks 851-854. All or a subset of any one or more of the blocks 851-854 can be executed in accordance with the discussion above.

The method 850 begins at block 851 by fabricating a substrate for the upper module package. Fabricating the substrate can include forming a cavity in a bottom side (e.g., a second side) of the substrate. Forming the cavity can include drilling (e.g., using a laser or other drill) or etching a cavity in the second side of the substrate. Dimensions of the cavity can correspond to dimensions of one or more electronic devices (e.g., one or more ASICs, semiconductor dies, controllers, etc.) mounted to a top side of a substrate of a main module package. For example, a height or depth of the cavity (measured from a bottom of the substrate toward a first side of the substrate opposite the bottom or second side) can correspond to a height of an electronic device when the electronic device is mounted to a first side of a substrate of a main module package. The cavity formed in the second side of the substrate can be rectangular-shaped, n-shaped, c-shaped, tunnel-shaped, or have any other suitable shape.

Fabricating the substrate can further include forming one or more electrical contacts at the first side of the substrate, forming electrical contacts at the second side of the substrate, and/or forming interconnects or vias within the substrate to couple electrical contacts at the second side to corresponding electrical contacts at the first side. In some embodiments, the electrical contacts at the first side include first electrical contacts (e.g., bond pads, bond fingers) configured to be coupled to one or more electronic devices. Additionally, or alternatively, electrical contacts at the first side include second electrical contacts (e.g., bond pads) configured to be coupled to electrical contacts at an active side or face of an electronic device. In these and other embodiments, the electrical contacts at the second side include third electrical contacts (e.g., bond pads) configured to be coupled (e.g., via solder) to corresponding electrical contacts at a first side of a substrate of a main module package. The third electrical contacts can be formed at positions about a perimeter of the cavity in the second side of the substrate of the upper module package.

At block 852, the method 850 continues by mounting one or more electronic devices on the first side of the substrate of the upper module package. In some embodiments, the electronic device(s) include semiconductor die(s), memory die(s), NAND dies, or one or more other types of electronic devices. Mounting the electronic device(s) on the first side of the substrate can include mounting an electronic device on the first side of the substrate such that an active side or face of the electronic device is oriented away from the first side of the substrate. The electronic device can be mounted to the first side of the substrate using a die attach film or other methodology. One or more additional electronic devices can be stacked on top of the electronic device that is mounted to the first side of the substrate, such that active sides of the additional electronic devices are also oriented away from the first side of the substrate. When stacked, the electronic devices can be staggered or laterally offset from one another such that electrical contacts at the active sides of the electronic devices are accessible for coupling the electrical contacts to the first electrical contacts at the first side of the substrate. Wire bonds or other electrical connectors can be used to coupled the electrical contacts at the active sides of the electronic devices to the first electrical contacts.

In other embodiments, mounting the electronic device(s) on the first side of the substrate can include mounting an electronic device such that electrical contacts at an active side or face of the electronic device is coupled to the second electrical contacts at the first side of the substrate (e.g., using solder). In these and other embodiments, mounting the electronic device(s) on the first side of the substrate can include applying an underfill material between the active side of the electronic device and the first side of the substrate, and about electrical connections formed between electrical contacts at the first side of the substrate and electrical contacts at the active side of the electronic device. Additional electronic devices can be stacked on top of the electronic device mounted to the first side of the substrate, and via can be used to electrically couple electronic devices of a stack to one another.

In some embodiments, mounting the electronic device(s) on the first side of the substrate can include mounting the electronic device(s) such that the electronic device(s) are positioned at a center of the first side of the substrate, or are positioned at a location laterally offset or spaced apart from the center of the first side of the substrate. In these and other embodiments, mounting the electronic device(s) on the first side of the substrate can include mounting electronic devices on the first side of the substrate such that the electronic devices fit entirely within a footprint of the first side of the substrate and/or such that none of the electronic devices hang over an edge of the first side of the substrate and are unsupported.

At block 853, the method 850 continues by applying a mold compound over the electronic devices mounted on the first side of the substrate of the upper module package. Applying the mold compound can include applying the mold compound such that the mold compound encapsulates the electronic devices mounted on the first side of the substrate. In these and other embodiments, applying the mold compound can include applying the mold compound such that at least some of the mold compound contacts the first side of the substrate. In these and still other embodiments, applying the mold compound can include applying the mold compound such that the mold compound is constrained to a footprint of the first side of the substrate.

At block 854, the method 850 continues by testing the upper module package. Testing the upper module package can include testing the upper module package independent of and/or separate from a corresponding main module package. For example, testing the upper module package can include testing the upper module package when the upper module package is not mounted on a main module package. In these and other embodiments, testing the upper module package can include testing the upper module package after mounting the upper module package on a main module package. Such testing of the upper module package after the upper module package has been mounted on a main module package can include testing the upper module package independent of the main module package and/or testing the upper module package in tandem with (e.g., together with, or at the same time as testing) the main module package.

Testing the upper module package can include determining that the upper module package is functioning as intended (e.g., without errors). When the upper module package is proven via testing to be functioning as intended, the upper module package can be cleared for integration with a main module package, and/or can be stored for later selection and use with a corresponding main module package. Alternatively, testing the upper module package can include determining that the upper module package is not functioning as intended. Determining that the upper module package is not functioning as intended can include identifying a component of the upper module package that is malfunctioning. In these and other embodiments, determining that the upper module package is not functioning as intended can include debugging, servicing, and/or replacing malfunctioning components of the upper module package. Additionally, or alternatively, determining that the upper module package is not functioning as intended can include scrapping the upper module package.

Although the steps of the method 850 are discussed and illustrated in a particular order, the method 850 is not so limited. In other embodiments, the method 850 can be performed in a different order. In these and other embodiments, any of the steps 851-854 of the method 850 can be performed before, during, and/or after any of the other steps 851-854 of the method 850. For example, the cavity and/or the electrical contacts can be formed at the second side of the substrate before, during, or after performing all or a subset of the blocks 852 and/or 853. Furthermore, the method 850 can be altered and still remain within these and other embodiments of the present technology. For example, one or more steps 851-854 of the method 850 can be omitted and/or repeated in some embodiments. As a specific example, block 854 can be omitted in some embodiments.

FIG. 9 is a flow diagram illustrating a method 960 of assembling a SiP in accordance with various embodiments of the present technology. The SiP can be the SiP 100, 500, 600, and/or 700 of FIGS. 1A, 1B, 5A, 5B, 6A, 6B, 7A, and/or 7B, and/or another SiP of the present technology. The method 960 is illustrated as a set of steps or blocks 961-968. All or a subset of any one or more of the blocks 961-968 can be executed in accordance with the discussion above.

The method 960 being at block 961 by selecting a main module package from a set of at least two main module packages. In some embodiments, each main module package of the set can include different electronic devices mounted to a first side of a corresponding substrate, different peripheral components, different layouts, and/or different specifications from all other main module packages of the set. In addition, each main module package of the set can be proven via testing to be functioning as intended (e.g., without errors).

At block 962, the method continues by selecting an upper module package from a set of at least two upper module packages. In some embodiments, each upper module package of the set can include different electronic devices (e.g., one or more electronic devices having different dimensions, different memories, etc.), different electrical contact layouts, a different cavity at a second side of a corresponding substrate, and/or different specifications from all other upper module packages of the set. In these and other embodiments, each upper module package of the set can be compatible with each main module package of the set of at least two main module packages described above with reference to block 961. In addition, each upper module package of the set can be proven via testing to be functioning as intended (e.g., without errors).

At block 963, the method continues by mounting the selected upper module package on a first side of a substrate of the selected main module package. Mounting the selected upper module package on the selected main module package can include aligning a cavity at a second (or bottom) side of a substrate of the upper module package with an electronic device mounted to a first side of the substrate of the main module package, and lowering the upper module package until the electronic device is positioned within and is generally surrounded by sidewalls of the cavity (e.g., at least about two sides of the electronic device). Additionally, or alternatively, mounting the selected upper module package on the selected main module package can include coupling electrical contacts at the second side of the substrate of the upper module package (e.g., electrical contacts positioned about a perimeter of the cavity) to corresponding electrical contacts at the first side of the substrate of the main module package, such as using solder. Coupling the electrical contacts at the second side of the substrate of the upper module package to electrical contacts at the first side of the substrate of the main module package can include placing the electronic device mounted on the first side of the substrate of the upper module package into electrical communication with one or more electronic devices mounted on a first side of the substrate of the upper module package.

At block 964, the method continues by applying an underfill material between the second side of the substrate of the upper module package and the first side of the substrate of the main module package. Applying the underfill material can include applying underfill material about electrical connections formed between electrical contacts at the first side of the substrate of the main module package and corresponding electrical contacts at the second side of the substrate of the upper module package.

At block 965, the method continues by testing the SiP. Testing the SiP can include testing the main module package independent of and/or separate from the upper module package. Additionally, or alternatively, testing the SiP can include testing the upper module package independent of and/or separate from the main module package. In these and other embodiments, testing the SiP can include testing the upper module package in tandem with (e.g., together with, or at the same time as testing) the main module package.

Testing the SiP can include determining that the SiP is functioning as intended (e.g., without errors). When the SiP is proven via testing to be functioning as intended, the method 960 can terminate without proceeding to blocks 966-968. In other embodiments, the method 960 can proceed to one or more of the blocks 966-968. Alternatively, testing the SiP can include determining that the SiP is not functioning as intended. Determining that the SiP is not functioning as intended can include identifying a component of the SiP that is malfunctioning. Identifying a malfunctioning component of the SiP can include debugging, servicing, and/or replacing the malfunctioning component. In the event that the method 960 determines that the SiP is not functioning as intended, the method 960 can proceed to one or more of blocks 966-968. For example, the method 960 can proceed to block 966 when the method 960 determines at block 965 that the SiP is not functioning as intended and/or when the method 960 identifies one or more peripheral components as malfunctioning components.

At block 966, the method continues by debugging, servicing, and/or replacing peripheral components. In some embodiments, debugging, servicing, and/or replacing the peripheral components includes accessing the peripheral components without removing a mold compound about the peripheral components and/or without disconnecting or unmounting the upper module package from the main module package.

At block 967, the method continues by disconnecting or unmounting the upper module package from the main module package. In some embodiments, disconnecting or unmounting the upper module package from the main module package is performed in response to determining that the upper module package and/or the main module package are malfunctioning. For example, the method 960 can disconnect or unmount the upper module package from the main module package when one or more components of the upper module package and/or one or more components of the main module package are not functioning as intended, and/or when debugging, servicing, and/or replacing those components is either not feasible or proves unsuccessful in returning the upper module package or the main module package to functioning as intended. Alternatively, disconnecting or unmounting the upper module package from the main module package can be performed in response to a decision to form a SiP with different specifications.

At block 968, the method continues by replacing the upper module package and/or the main module package. In some embodiments, replacing the upper module package includes selecting a different upper module package (block 962), mounting the different upper module package to the first side of the substrate of the main module package (block 963), applying an underfill material (block 964), and/or testing the resulting SiP (block 965). In these and other embodiments, replacing the upper module package includes servicing and/or scrapping the upper module package (e.g., in the event one or more components of the upper module package are malfunctioning). Additionally, or alternatively, replacing the upper module package includes mounting the upper module package to another main module package and/or storing the upper module package for later selection and use with another main module package (e.g., in the event that the upper module package is functioning as intended, such as before or after being disconnected from the main module package and/or after servicing of the upper module package).

In some embodiments, replacing the main module package includes selecting a different main module package (block 961), mounting the upper module package to a first side of a substrate of the different main module package (block 963), applying an underfill material (block 964), and/or testing the resulting SiP (block 965). In these and other embodiments, replacing the main module package includes servicing and/or scrapping the main module package (e.g., in the event one or more components of the main module package are malfunctioning). Additionally, or alternatively, replacing the main module package includes mounting another upper module package to the main module package and/or storing the main module package for later selection and use with another upper module package (e.g., in the event that the main module package is functioning as intended, such as before or after being disconnected from the upper module package and/or after servicing of the main module package).

Although the steps of the method 960 are discussed and illustrated in a particular order, the method 960 is not so limited. In other embodiments, the method 960 can be performed in a different order. For example, block 965 can be performed before block 964. In these and other embodiments, any of the steps 961-968 of the method 960 can be performed before, during, and/or after any of the other steps 961-968 of the method 960. For example, block 962 can be performed before, during, or after performing block 962. Furthermore, the method 960 can be altered and still remain within these and other embodiments of the present technology. For example, one or more steps 961-968 of the method 960 can be omitted and/or repeated in some embodiments. As a specific example, one or more of the blocks 964-968 can be omitted in some embodiments.

Figure 10:
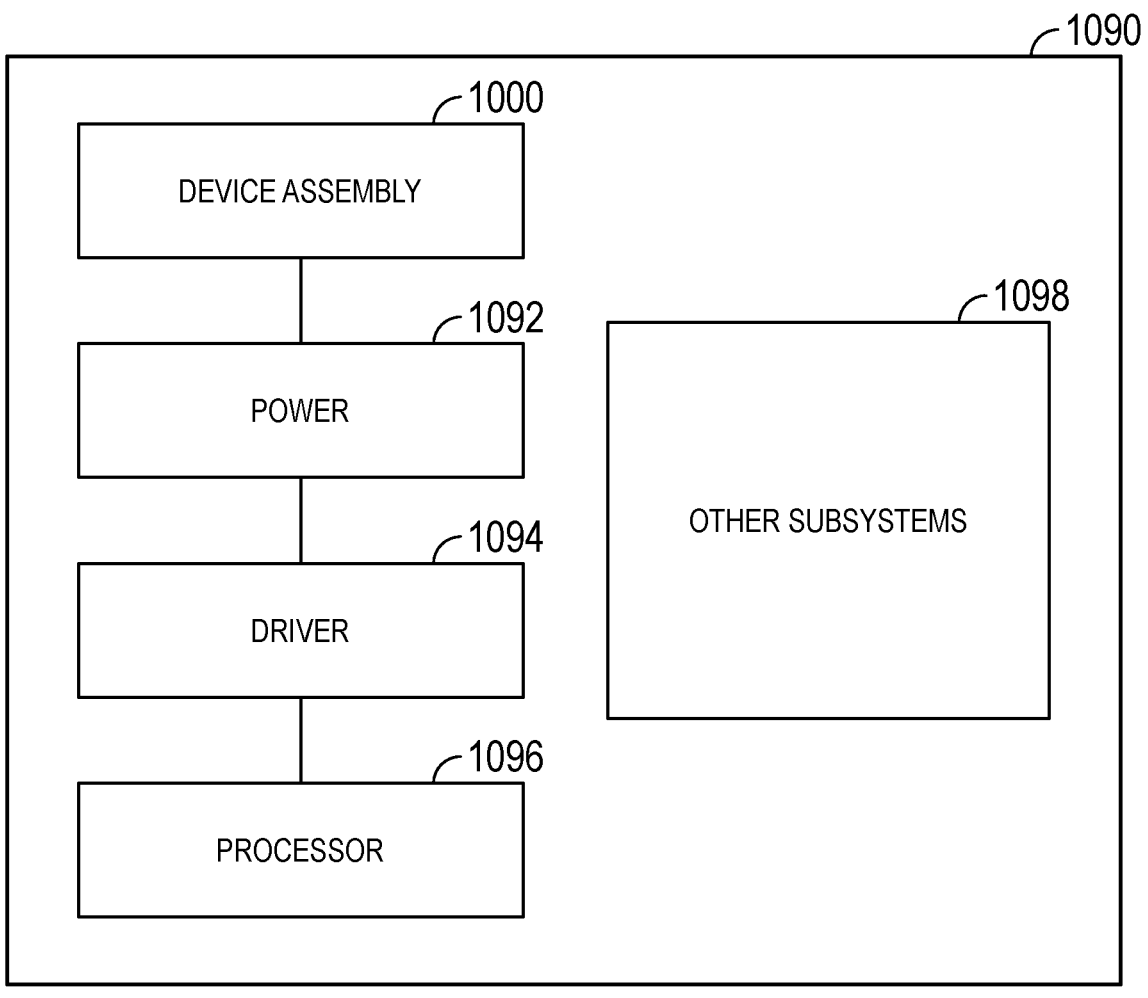
FIG. 10 is a schematic view of a system that includes a semiconductor device configured in accordance with various embodiments of the present technology.

Any of the modules and/or systems described above with reference to FIGS. 1-9 can be incorporated into any of a myriad of larger and/or more complex systems, a representative example of which is system 1090 shown schematically in FIG. 10. The system 1090 can include a semiconductor device assembly 1000, a power source 1092, a driver 1094, a processor 1096, and/or other subsystems or components 1098. The semiconductor device assembly 1000 can include semiconductor devices with features generally similar to those of the substrates and/or systems described above. The resulting system 1090 can perform any of a wide variety of functions, such as memory storage, data processing, and/or other suitable functions. Accordingly, representative systems 1090 can include, without limitation, hand-held devices (e.g., mobile phones, tablets, digital readers, and digital audio players), computers, and appliances. Components of the system 1090 may be housed in a single unit or distributed over multiple, interconnected units (e.g., through a communications network). The components of the system 1090 can also include remote devices and any of a wide variety of computer readable media.

From the foregoing, it will be appreciated that specific embodiments of the technology have been described herein for purposes of illustration, but well-known structures and functions have not been shown or described in detail to avoid unnecessarily obscuring the description of the embodiments of the technology. Where the context permits, singular or plural terms can also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. As used herein, the phrase "and/or" as in "A and/or B" refers to A alone, B alone, and both A and B. Additionally, the terms "comprising," "including," "having," and "with" are used throughout to mean including at least the recited feature(s) such that any greater number of the same feature(s) and/or additional types of other features are not precluded. Moreover, the terms "connect" and "couple" are used interchangeably herein and refer to both direct and indirect connections or couplings. For example, where the context permits, element A "connected" or "coupled" to element B can refer (i) to A directly "connected" or directly "coupled" to B and/or (ii) to A indirectly "connected" or indirectly "coupled" to B.

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology, as those skilled in the relevant art will recognize. For example, while steps are presented in a given order, alternative embodiments can perform steps in a different order. As another example, various components of the technology can be further divided into subcomponents, and/or various components and/or functions of the technology can be combined and/or integrated. Furthermore, although advantages associated with certain embodiments of the technology have been described in the context of those embodiments, other embodiments can also exhibit such advantages, and not all embodiments need necessarily exhibit such advantages to fall within the scope of the present technology.

It should also be noted that other embodiments in addition to those disclosed herein are within the scope of the present technology. For example, embodiments of the present technology can have different configurations, components, and/or procedures in addition to those shown or described herein. Moreover, a person of ordinary skill in the art will understand that these and other embodiments can be without several of the configurations, components, and/or procedures shown or described herein without deviating from the present technology. Accordingly, the disclosure and associated technology can encompass other embodiments not expressly shown or described herein.

What is claimed is:

1. A system, comprising:
 a main module package including a first substrate and a first electronic device mounted on a first side of the first substrate; and an upper module package including a second substrate and one or more second electronic devices mounted on a first side of the second substrate, wherein the second substrate includes a cavity at a second side of the second substrate opposite the first side, and wherein the second substrate has a varying thickness between the first side and the second side of the second substrate, and wherein the upper module package is mounted on the first side of the first substrate of the main module package such that the first electronic device is positioned within the cavity and the second substrate generally surrounds at least a portion of a perimeter of the first electronic device.

2. The system of claim 1, wherein:

the first substrate includes a plurality of first electrical contacts at the first side of the first substrate;

the second substrate includes a plurality of second electrical contacts at bottommost portions of the second side of the second substrate; and when the upper module package is mounted to the first side of the first substrate of the main module package, individual ones of the plurality of first electrical contacts are coupled to corresponding individual ones of the plurality of second electrical contacts.

3. The system of claim 2, wherein at least some second electrical contacts of the plurality of second electrical contacts are distributed about a perimeter of the cavity.

4. The system of claim 2, wherein the second substrate further includes (a) a plurality of third electrical contacts at the first side of the second substrate and (b) interconnects coupling individual ones of the plurality of third electrical contacts to corresponding ones of the plurality of second electrical contacts.

5. The system of claim 4, wherein a layout of at least some of the plurality of second electrical contacts, at least some of the plurality of third electrical contacts, and at least some of the interconnects corresponds to a pinout of the first electronic device of the main module package.

6. The system of claim 1, wherein the upper module package further includes a mold compound disposed on the first side of the second substrate and over the one or more second electronic devices, and wherein the mold compound is constrained to a footprint of the first side of the second substrate.

7. The system of claim 1, wherein:

the main module package further includes at least one peripheral component mounted on the first side of the first substrate;

when the upper module package is mounted to the first side of the first substrate of the main module package, the at least one peripheral component is laterally spaced apart from the upper module package on the first side of the first substrate; and at least one peripheral component is exposed on the first substrate such that it is accessible or replacement without first removing a mold compound.

8. The system of claim 7, wherein the at least one peripheral component includes a capacitor.

9. The system of claim 1, wherein, when the upper module package is mounted to the first side of the first substrate of the main module package, a height of the cavity measured from the first side of the first substrate is greater than or equal to a height of an uppermost surface of the first electronic device measured from the first side of the first substrate.

10. The system of claim 1, wherein the cavity is sized and shaped such that the cavity fully surrounds the perimeter of the first electronic device when the upper module package is mounted to the first side of the first substrate of the main module package and the first electronic device is positioned within the cavity.

11. The system of claim 1, wherein the cavity is sized and shaped such that (a) the cavity partially surrounds the perimeter of the first electronic device when the upper module package is mounted to the first side of the first substrate of the main module package and the first electronic device is positioned within the cavity, and (b) the first electronic device is exposed through at least one side of the second substrate that is oriented generally perpendicular to the first side of the second substrate.

12. The system of claim 1, wherein the first electronic device is centered on the first side of the first substrate.

13. The system of claim 1, wherein the one or more second electronic devices are fully positioned within a footprint of the first side of the second substrate such that the one or more second electronic devices do not extend beyond edges of the first side of the second substrate.

14. The system of claim 1, wherein:

the first electronic device is an application-specific integrated circuit; and the one or more second electronic devices include NAND memory dies.

15. The system of claim 1, wherein the first side of the second substrate is generally planar across a full width or a full length of the first side of the second substrate.

16. An upper module package for use with a main module package to form a system in package, the upper module package comprising:

a substrate with a varying thickness and having a first side, a second side opposite the first side, a recess in the second side resulting in the varying thickness, a first electrical contact disposed in or on the first side, a second electrical contact disposed in or on the second side, and an interconnect coupling the first electrical contact to the second electrical contact; and at least one electronic device mounted on the first side of the substrate, wherein the at least one electronic device includes a third electrical contact coupled to the first electrical contact, wherein a depth of the recess in the second side of the substrate is greater than or equal to a thickness of an electronic device on a first side of a substrate of the main module package.

17. The upper module package of claim 16, wherein the depth of the recess is greater than or equal to a thickness of an electronic device of the at least one electronic device mounted on the first side of the substrate.

18. A method of assembling a system in package, the method comprising:

selecting a main module package comprising a first substrate, a first electronic device mounted on a first side of the first substrate, and a first electrical contact at the first side of the first substrate;

selecting an upper module package from a set of at least two different upper module packages, wherein each upper module package of the set is compatible with the main module package, wherein each upper module package of the set includes (i) a second substrate with a varying thickness and having a first side, a second side opposite the first side, a cavity in the second side contributing to the varying thickness, a second electrical contact at the second side, and interconnects between the first side and the second side of the second substrate, and (ii) a second electronic device mounted on the first side of the second substrate and coupled to the second electrical contact via the interconnects, and wherein the second electronic devices of the upper module packages of the set are different from one another, layouts of the interconnects within the second substrates of the upper module packages of the set are different from one another, or a combination thereof; and mounting the selected upper module package on the first side of the first substrate such that—

(a) the first electronic device is positioned within the cavity and is surrounded by the second substrate along at least two perimeter sides of the first electronic device, and (b) the first electrical contact is coupled to the second electrical contact.

19. The method of claim 18, wherein:

the method further comprises, after mounting the selected upper module package on the first side of the first substrate— removing the selected upper module package from the first side of the first substrate, and mounting another upper module package on the first side of the first substrate;

the other upper module package is compatible with the main module package, the other upper module package of the set includes (i) a third substrate having a first side, a second side opposite the first side, a cavity in the second side, a third electrical contact at the second side, and interconnects between the first side and the second side of the second substrate, and (ii) a third electronic device mounted on the first side of the third substrate and coupled to the third electrical contact via the interconnects; and the third electronic device of the is different from the second electronic device of the selected upper module package, a layout of the interconnects within the third substrate is different from the layout of the interconnects within the second substrate of the selected upper module package, or a combination thereof.

20. The method of claim 18, wherein:

the method further comprises, after mounting the selected upper module package on the first side of the first substrate— removing the selected upper module package from the first side of the first substrate, and mounting another upper module package on the first side of the first substrate;

the other upper module package is compatible with the main module package, the other upper module package of the set includes (i) a third substrate having a first side, a second side opposite the first side, a cavity in the second side, a third electrical contact at the second side, and interconnects between the first side and the second side of the second substrate, and (ii) a third electronic device mounted on the first side of the third substrate and coupled to the third electrical contact via the interconnects; and the third electronic device is identical to the second electronic device of the selected upper module package, a layout of the interconnects within the third substrate is identical to the layout of the interconnects within the second substrate of the selected upper module package, or a combination thereof.

21. The method of claim 18, wherein:

the main module package further comprises a capacitor mounted on the first side of the first substrate and laterally spaced apart from the first electronic device on the first side of the first substrate such that a peripheral component is laterally spaced apart from the selected upper module package when the selected upper module package is mounted on the first side of the first substrate; and the method further comprises servicing, debugging, or replacing the capacitor while the selected upper module package is mounted on the first side of the first substrate and without first removing a mold compound.

* * * * *